United States Patent [19]
Lee

[11] Patent Number: 5,905,289
[45] Date of Patent: May 18, 1999

[54] PLANARIZED METALLURGY STRUCTURE FOR A SEMICONDUCTOR AND PROCESS OF FABRICATION

[75] Inventor: Jin-Yuan Lee, Hsin-Chu, Taiwan

[73] Assignee: Taiwan Semiconductor Manufacturing Company, Hsin-Chu, Taiwan

[21] Appl. No.: 09/044,762

[22] Filed: Mar. 20, 1998

Related U.S. Application Data

[62] Division of application No. 08/888,854, Jul. 7, 1997, Pat. No. 5,789,313, which is a continuation of application No. 08/489,321, Jun. 12, 1995, abandoned, which is a division of application No. 08/214,852, Mar. 18, 1994, Pat. No. 5,441,915, which is a continuation of application No. 07/937,746, Sep. 1, 1992, abandoned.

[51] Int. Cl.$^6$ ................................................ H01L 29/72
[52] U.S. Cl. ..................... 257/368; 257/390; 257/401; 257/503; 257/773; 257/786
[58] Field of Search ..................................... 257/368, 390, 257/401, 503, 773, 786

[56] References Cited

U.S. PATENT DOCUMENTS 5,077,234   12/1991   Scoopo et al. ......................... 257/368

OTHER PUBLICATIONS

"Improved Sub–Micron Inter–Metal Dielectric Gap–Filling Using TEOS/Ozone APCVD", Microelectronics Manufacturing Technology, pp. 22–27, Jan. 1992.

*Primary Examiner*—Edward Wojciechowicz
*Attorney, Agent, or Firm*—George O. Saile; Stephen B. Ackerman; Wolmar J. Stoffel

[57] ABSTRACT

A method for fabricating a metallurgy system is described wherein a first level of metallurgy is formed, having a plurality of close uniformly spaced conductive line of a predetermined width, and wherein there are included larger gaps between the conductive lines. The areas in the larger gaps are filled with dummy lines, where the gap is equal to or greater than three times the feature size or alternatively the width of the conductive lines.

9 Claims, 10 Drawing Sheets

PLANARIZED METALLURGY STRUCTURE FOR A SEMICONDUCTOR AND PROCESS OF FABRICATION

This is a divisional of Ser. No. 08/888,854, Jul. 7, 1997, U.S. Pat. No. 5,789,313, which is a continuation of Ser. No. 08/489,321, Jun. 12, 1995, abandoned, which is a division of Ser. No. 08/214,852, Mar. 18, 1994, U.S. Pat. No. 5,441,915, which is a continuation of Ser. No. 07/937,746, Sep. 1, 1992, abandoned.

BACKGROUND OF THE INVENTION

1. Field of the Invention

This invention relates to a method, and the resulting structure, of fabricating semiconductor devices, and more specifically to a method of fabricating a multilevel planarized interconnection metallurgy system for integrated circuit devices.

2. Description of the Prior Art

The feature size in the state of the art of very large scale integrated circuits (VLSIs) such as high density memory chips, microprocessors and the like, has shrunk to the submicron level.

As the metal lines of the interconnection metallurgy systems have decreased, it is important to maintain as great a degree of surface planarity as possible. Surface planarity is critical in order (1) to accommodate the very shallow depths of fields of optical apparatus used for exposing the resist layers necessary to produce the metallurgy patterns, (2) to maintain a uniform metallurgy stripe thickness and (3) to avoid metal stringers.

When the initial metallurgy stripe pattern is formed on the planar surface of a substrate, it is subsequently covered by a dielectric layer. If the layer is conformal in nature, the resulting dielectric surface will be non-planar, i. e. the surface of the dielectric layer will dip down between the metal strips and thus present a surface with different levels. When a plurality of metallurgy layers are deposited, and each covered with a dielectric layer, each successive layers will contribute to the non-planarity, since there may be areas where a plurality of metal stripes are aligned or overlapped, and other areas where there may be less or no overlapped stripes.

A great deal of progress has been made in depositing the dielectric layer, so that the areas between the stripes will be filled while maintaining a greater degree of planarity. Such techniques include spin-on-glass (SOG) techniques, atmospheric pressure chemical vapor deposition (APCVD) techniques, tetraethylorthsilicate deposition in an atmosphere that contains $O_3$ (TEOS/$O_3$), and the like. These techniques have the capability to completely fill and locally planarize submicron gaps. These deposition techniques may be followed by an etch back to further promote planarity. The techniques are explained in an article in January 1992 Microelectronics Manufacturing Technology, Pages 22–27, entitled "Improved Sub-Micron Inter-Metal Dielectric Gap Filling using TEOS/Ozone APCVD".

However, while the above techniques fill submicron gaps between closely spaced metal lines, they are generally incapable of filling gaps between more distantly spaced lines. The problem is more clearly illustrated in FIGS. 1–5. FIGS. 1–5 show a semiconductor substrate 10 having a field effect transistor including source and drain regions 12, and gate 14. The substrate 10 also has a field oxide layer 16, and a relatively thick borophosphosilicate glass (BPSG) layer 18. A first metallurgy level including closely spaced metal stripes 20, and a widely spaced stripe 22, are shown in cross section. This is a typical device cross section, which illustrates the planarity problem presented by non-uniformly spaced metal stripes.

The reason for the non-uniform spacing is that the interconnection system must join the devices in an operative circuit, and it is not possible to design such a circuit where all the lines are uniformly spaced and parallel. In FIG. 2, there is illustrated the deposition of environment. FIG. 3 shows a dielectric layer 26 deposited by spin-on-glass techniques. Note that the gaps between closely spaced metal lines 20 are filled, but the wide gap between lines 20 and 22 is not filled, because of the limitations of the prior art processing. The problem with this wide gap is for the following layer lithography. It causes poor planarity for this next layer.

In FIG. 4, layer 26 is etched back which tends to increase the planarity of the top surface over closely spaced stripes 20, but does nothing to increase it in the wide gap. In FIG. 5, there is shown a layer 28 deposited by PE/CVD techniques. This layer still does not provide a planar surface over the wide gap. In practice, a second metallurgy layer would be deposited on the surface, after forming via holes to the metal stripes. It is believed apparent that as the metallurgy layers are built up, the surface planarity will deteriorate.

U.S. Pat. No. 5,077,234 proposes a solution to increase planarity of a semiconductor, when the semiconductor contains trenches or the like. The solution proposed utilizes three resist layers, and is believed to be inappropriate to the problem addressed by this invention.

SUMMARY OF THE INVENTION

An object of the invention is to provide a new method for maintaining surface planarity during and after an interconnection metallurgy system is fabricated on a semiconductor device.

In accordance with the aforementioned objectives, there is presented a method for fabricating a metallurgy system wherein a first level of metallurgy is formed, having a plurality of close uniformly spaced conductive line of a predetermined width, and wherein there are included larger gaps between the conductive lines. The areas in the larger gaps are filled with dummy lines, where the gap is equal to or greater than three times the feature size or alternatively the width of the conductive lines.

In accordance with the objectives, an improved semiconductor device having a planar global surface is presented. The substrate has a plurality of metallurgy levels, each level having a plurality of closely spaced conductive lines of a predetermined width and also gaps between the conductive lines. Dummy lines are provided in the gaps where the gaps are equal to or greater than three times the feature size, or the width of the conductive lines. Dielectric layers are provided between the metallurgy levels.

DETAILED DESCRIPTION OF THE PREFERRED EMBODIMENTS

The present invention will be described in detail with reference to the above described drawings. In practice, the structure illustrated will be only one of many supported on a common substrate and interconnected with suitable metallurgy into various electronic circuit configurations. The substrate may be a monocrystalline semiconductor body with many devices fabricated therein, and possibly thin film devices fabricated on the surface in various metallurgy levels, as is known in the prior art.

Figure 7:
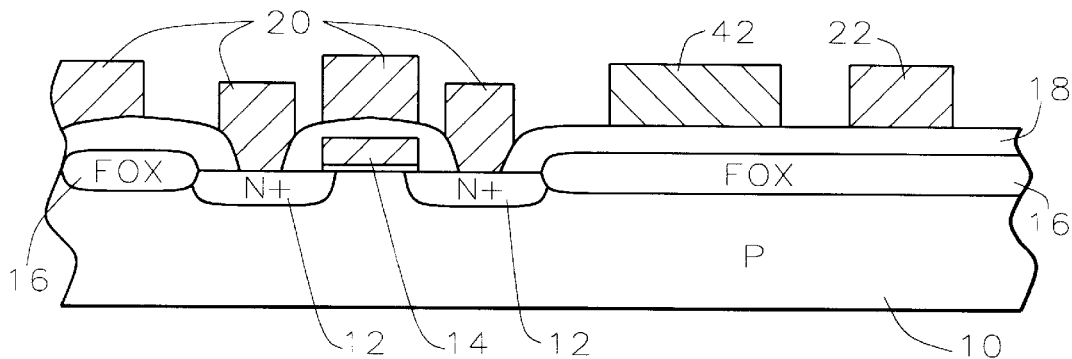
FIG. 7 is a cross sectional view of a semiconductor substrate complete with a first level of metallurgy that includes both conductive lines and dummy lines.

Referring now to FIG. 7, which illustrates a typical semiconductor substrate 10, provided with an FET device with source and drain 12, and gate 14, and field oxide regions 16 that serve as isolation barriers. While the drawings show the source and drain regions are N+ it is understood by those skilled in the art that the conductivity types can be made opposite and P+ source and drain regions 12 can be made. The substrate has a surface dielectric layer 18, typically borophospho-silicate glass. On the surface of substrate 10 is shown a first metallurgy level, consisting of metal stripes 20, i.e. a set of operative conductive lines that are closely spaced, and more distantly spaced operative conductive metal stripe 22. Normally, a dielectric layer, or combination of layers, is deposited over the metallurgy layer. The resultant non-planarity surface problems were discussed in relation to FIGS. 1–5, when stripes are widely spaced. In this invention, the widely spaced stripes in the various metallurgy levels are filled in with dummy lines prior to depositing a dielectric layer.

Figure 1:
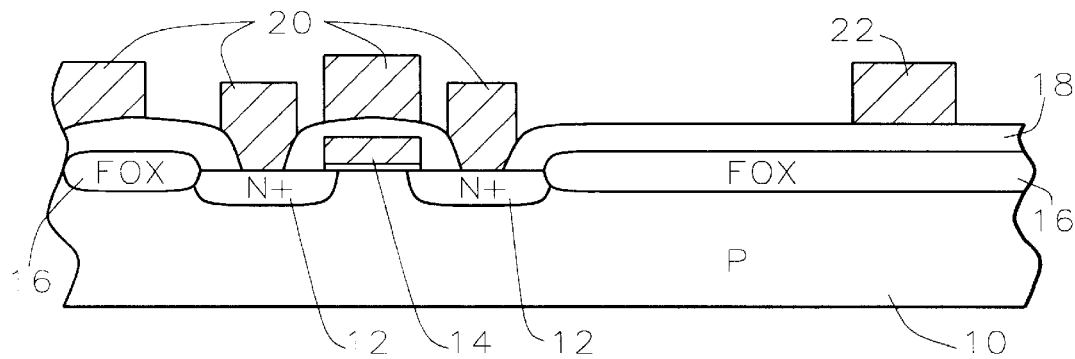
FIGS. 1–5 is a sequence of cross sectional views in greatly enlarged scale, that illustrates a planarity problem associated with metallurgy fabrication process known to the prior art.
Figure 2:
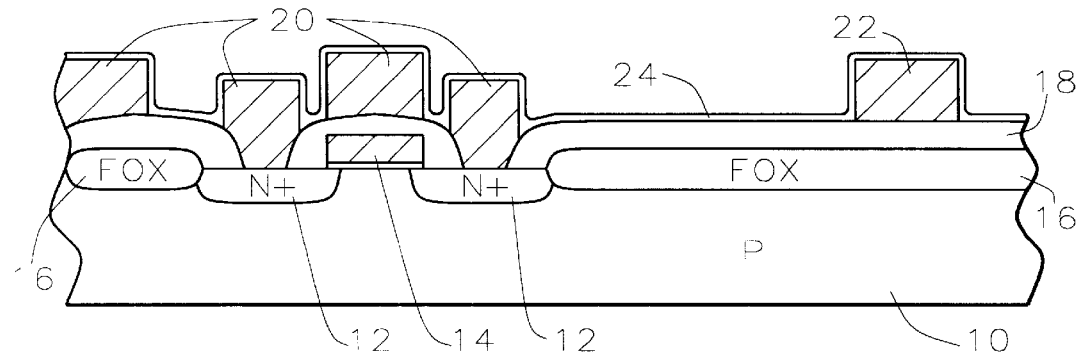
Figure 3:
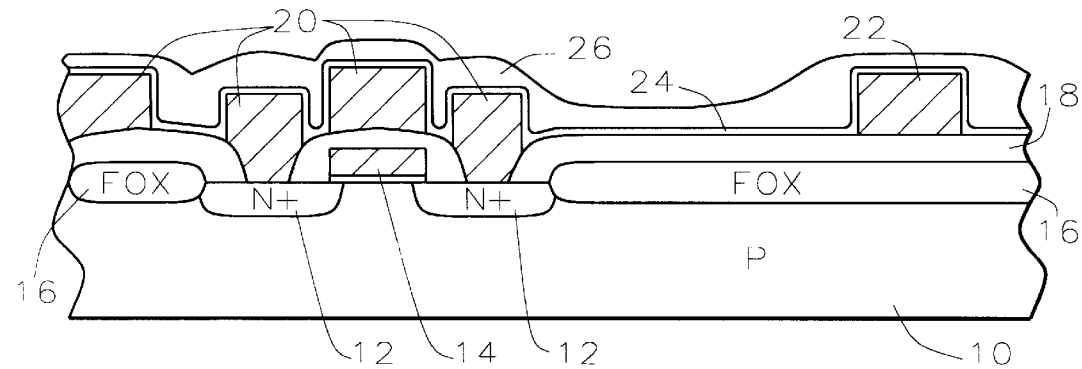
Figure 4:
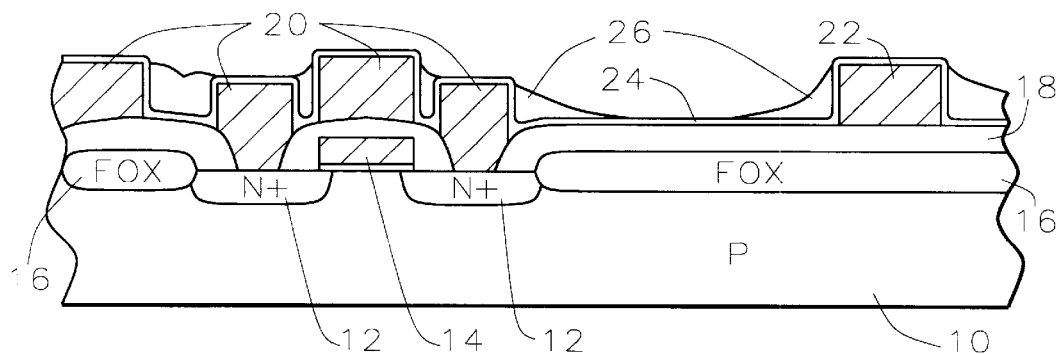
Figure 5:
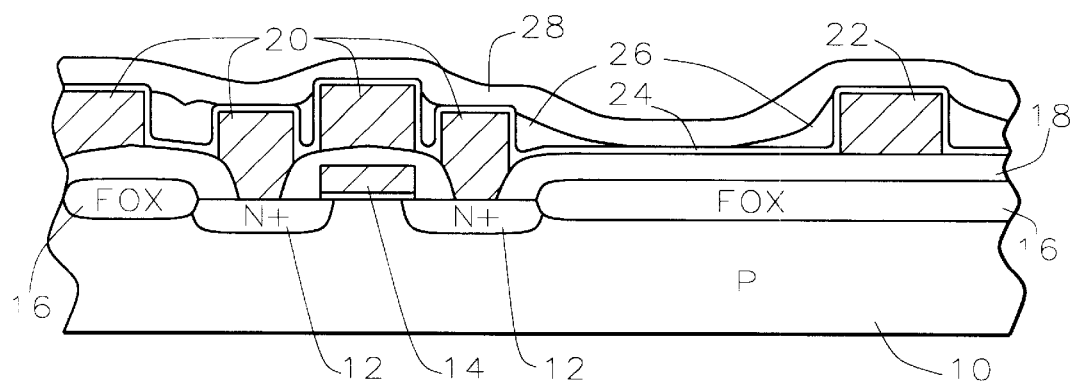
Figure 6:
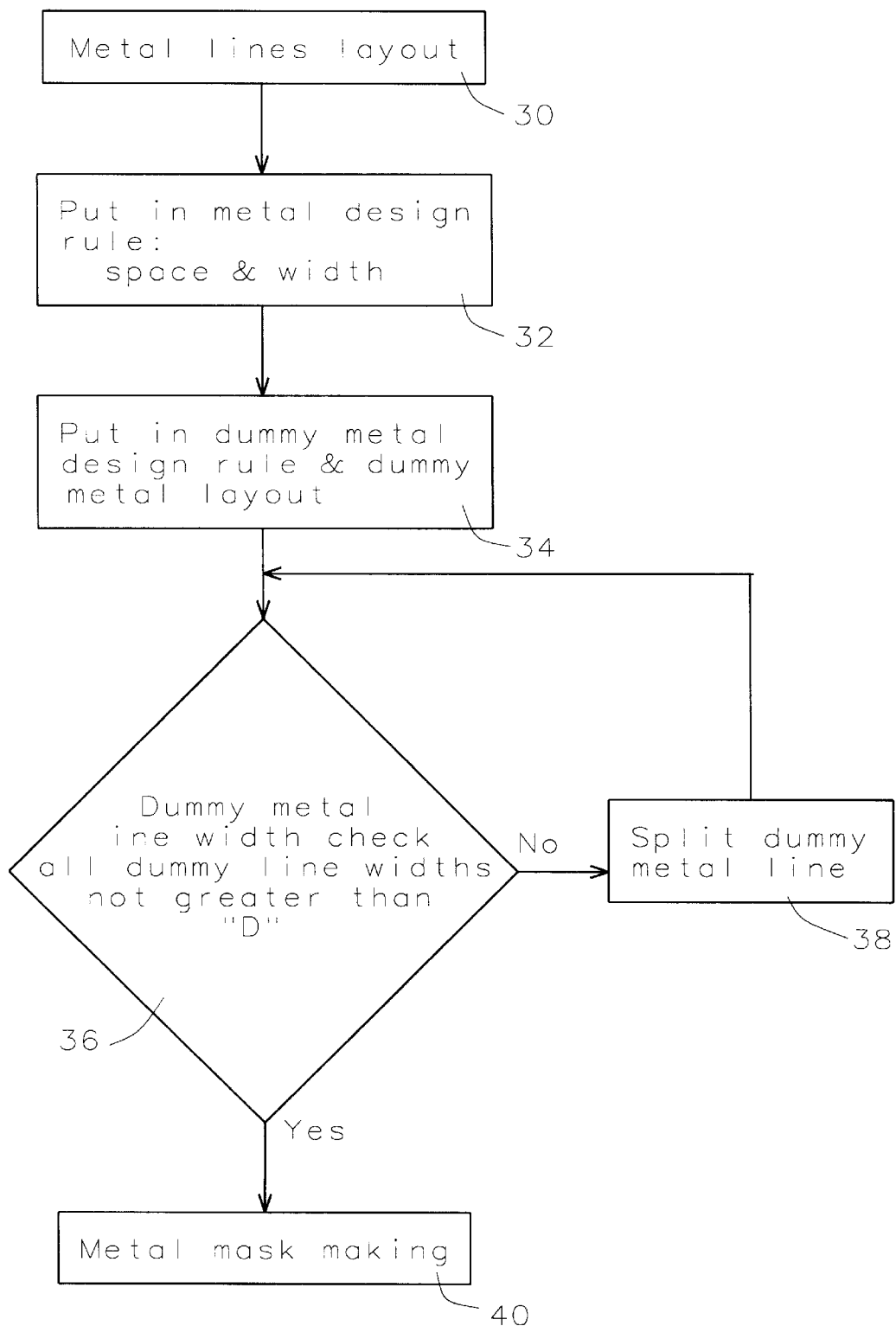
FIG. 6 is a flow chart that illustrates the steps in the process of the invention.

FIG. 6 illustrates the process of designing a metallurgy pattern that includes dummy lines in the mask used to fashion the metallurgy level. Block 30 indicates the step of designing the necessary conductive lines of the metallurgy level to provide for operative devices. Obviously, the design will take into account the interaction with overlying metallurgy levels. Block 32 indicates the step of using the design rule for the particular application, i.e. specifying the necessary width of the conductive lines and spacing of the lines in the metallurgy level to suit the particular application. Normally the width of the line will approximately equal the spacing of the lines in areas where lines are closely spaced. The "feature size" limits minimum dimension of the line, since this is the smallest size feature that can be formed by the lithography techniques used to form the metallurgy. The feature size is defined by a number of factors, such as the wavelength of the light used to expose the pattern, the type of resist, etc, which is known in the art. In this discussion, the metal stripe width is construed to be the "feature size".

Block 34 indicates placing in operation the design rule for determining where the dummy lines are to be placed in the metallurgy level. In accordance with the invention, the conductive line pattern is examined to locate large areas between lines which can be filled in with dummy lines or areas. When the width "D" of the spaces between the lines equals or exceeds three times the feature size, or the width of the conductive line, a dummy line or area is designed to fill the space. Obviously, the dummy lines will be spaced from the conductive lines. Block 36 indicates the next step of examining the width of the dummy lines. If the width of the space between the conductive lines is equal to or greater than five times the width of the conductive lines, or alternatively if the width of the dummy line is equal to or greater than three times the width of the conductive line, a plurality of dummy lines may be substituted for the single wider dummy line. This step is indicated by block 38. Finally, after the appropriate changes have been made, the mask is fabricated, as indicated by block 40.

It is preferable that the width "D" of the dummy lines be restricted in width to less then one micrometer in order to present possible hillock growth which would potentially cause shorting between metallurgy levels. The smaller the size of the line width, the less possibility of hillock growth. It is also better to have uniformity of width of the plurality of dummy lines, because this produces a more uniform etching or patterning of the conductive/dummy lines.

Figure 7A:
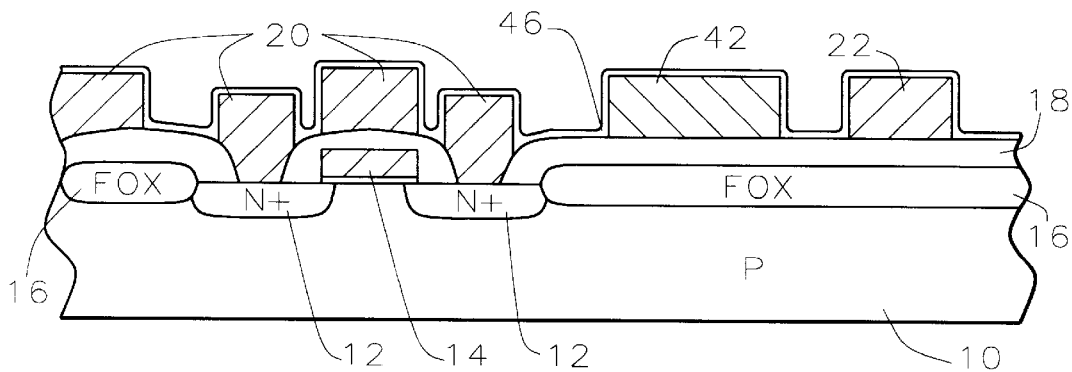
FIGS. 7A–7D show a sequence of sectional views for planarizing the structure of FIG. 7 that depict a first method embodiment of the invention.
Figure 11:
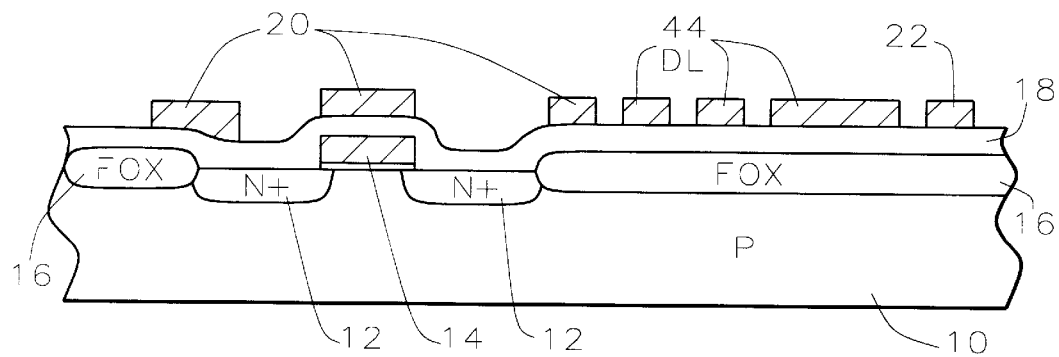
FIG. 11 is a cross sectional view illustrating a device provided with a plurality of adjacent spaced dummy lines.

As indicated in FIG. 7, a dummy metal stripe 42 is provided between lines 20 and 22. Alternatively, a plurality of dummy stripes 44 is provided between lines 20 and 22 where the spacing is greater, as indicated in FIG. 11. The metallurgy level, including stripes 20, 22, and 42, is then covered with a dielectric layer with a top surface that is a planar as possible. The dummy line 42 will eliminate the large depression, discussed in FIGS. 1–5. As indicated in FIG. 7A, a first preferred embodiment of a dielectric layer includes forming a thin conformed layer 46 over stripes 20, 22, and 42. Layer 46 is formed by plasma enhanced oxidation (PE-OX), with a thickness in the range of about 400 to 3000 Angstroms. The layer 46 can be deposited by plasma enhanced chemical vacuum deposition. The reason for layer 46 is to level the topography.

Figure 7B:
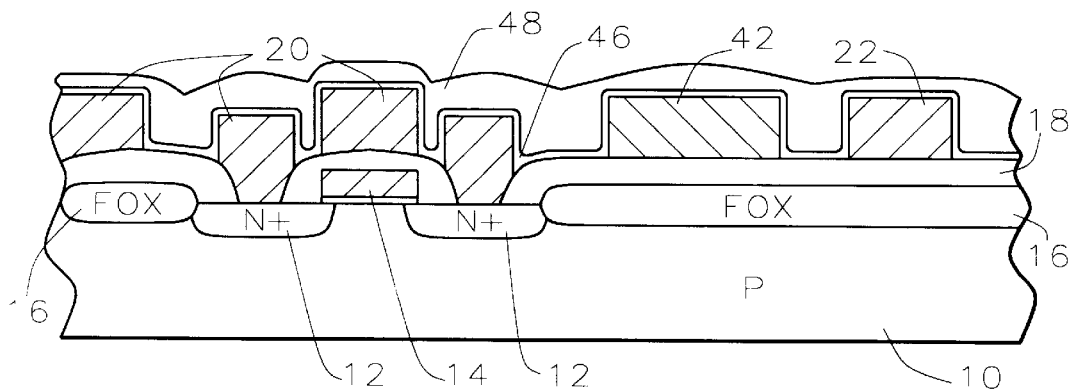

As shown in FIG. 7B, a layer of dielectric 48 is deposited by spin-on-glass techniques (SOG), and cured. The layer 48 fills in the gaps between the lines and presents a relatively planar surface. Layer 48 can be deposited by spin-on-glass techniques, baking at between about 150 to 260° C. for a few minutes or so to drive out the solvents from the layer, curing the layer at between about 400 to 450° C. for 30 to 60 minutes to form the silicon oxide insulating layer. The spin-on-glass layer used may be a silicate or siloxane type material. Where the siloxane type material is used the resulting cured layer would have a polymeric content.

Figure 7C:
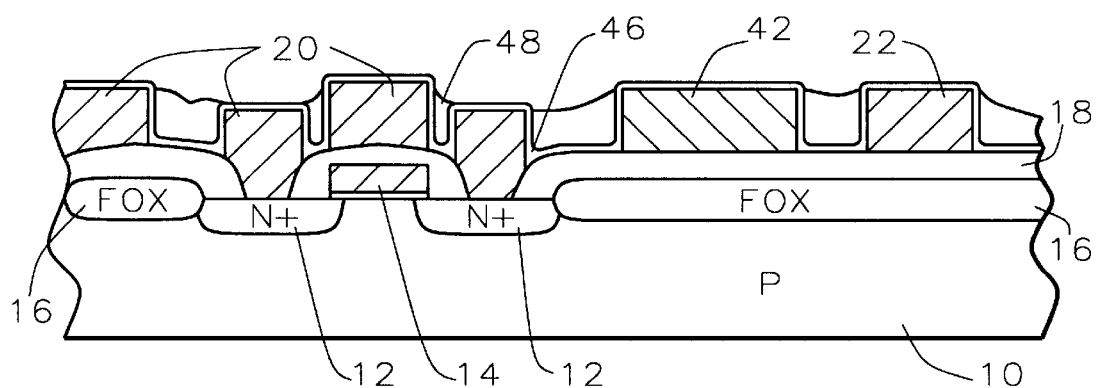

As shown in FIG. 7C, the top surface of the dielectric layer 46 and 48 is etched back preferably after spin-on-glass curing to further enhance the surface planarity. This etchback can be achieved by anisotropic reactive ion etching processing using $CHF_3/CF_4$.

Figure 7D:
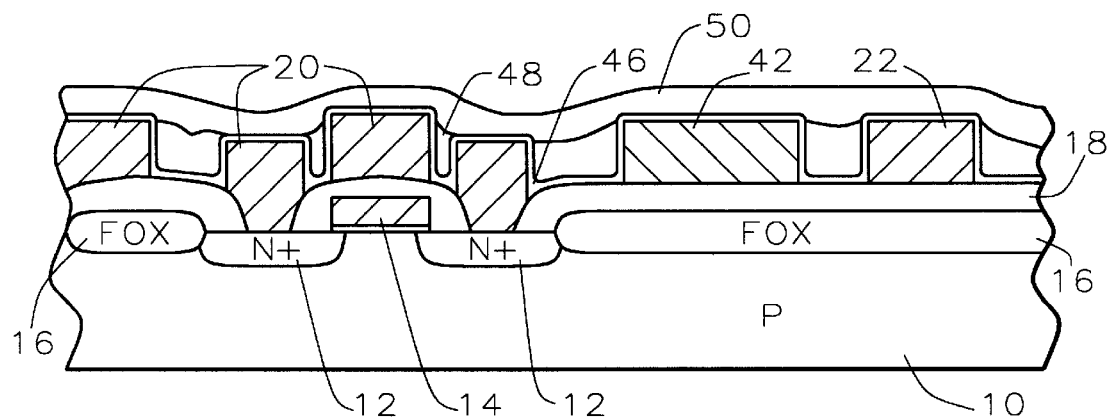

As shown in FIG. 7D, a top dielectric layer 50 is deposited by plasma enhanced chemical vapor deposition (PE-CVD) techniques, such use of TEOS or silane processing at about 370 to 400° C. The layer 50 has a thickness in the range of about 2000 to 8000 Angstroms. Vias are then formed in the dielectric layers 46 and 48 and another metallurgy level and dielectric layer is formed, repeating the aforementioned steps.

Figure 8A:
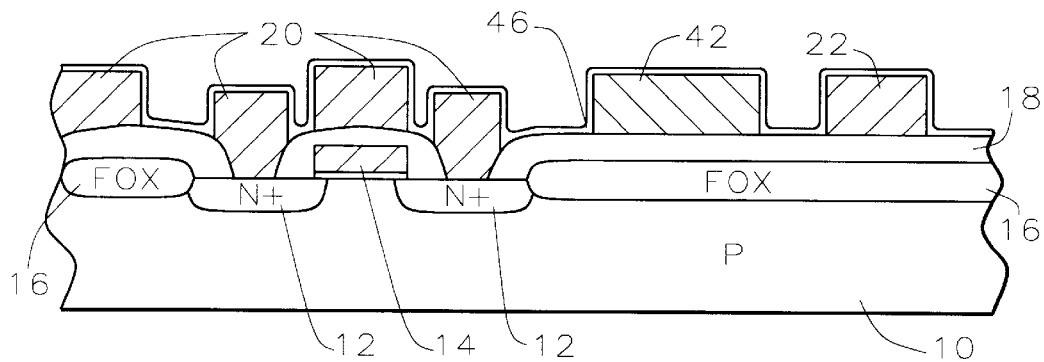
FIGS. 8A–8C is a sequence of sectional views that follow from FIG. 7 that illustrates a first preferred embodiment of the invention.
Figure 8B:
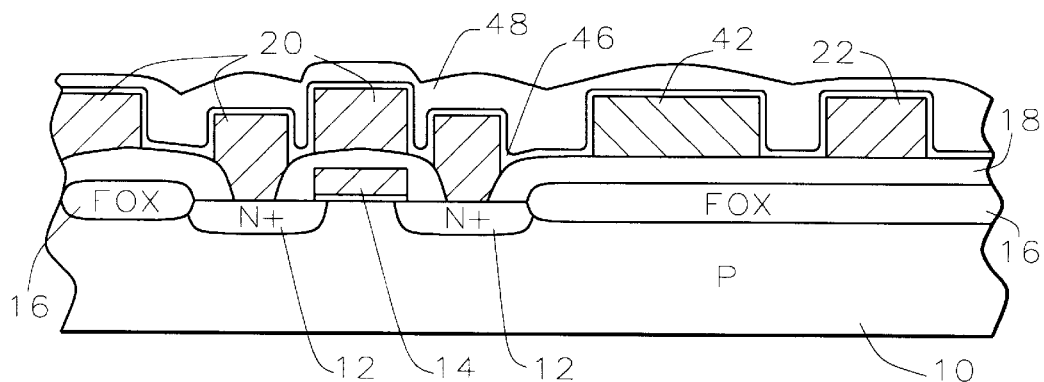
Figure 8C:
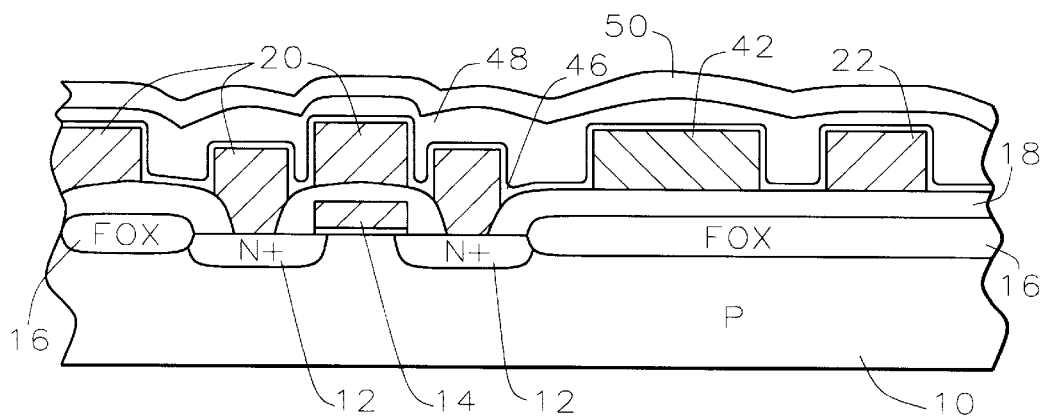

Another embodiment of the invention is depicted in FIGS. 8A–8C. The figures follow from FIG. 7 which shows the substrate complete with metal and conductive lines and dummy lines. The lines 20, 22, and 42 are covered with conformal layer 46, as described previously. A spin-on-glass layer 48 is deposited as previously described, and cured. As shown in FIG. 8C a top (PE-CVD) layer 50 is deposited as previously described having a thickness in the range of 2000 to 8000 Angstroms. In this embodiment there is no etchback.

Figure 9A:
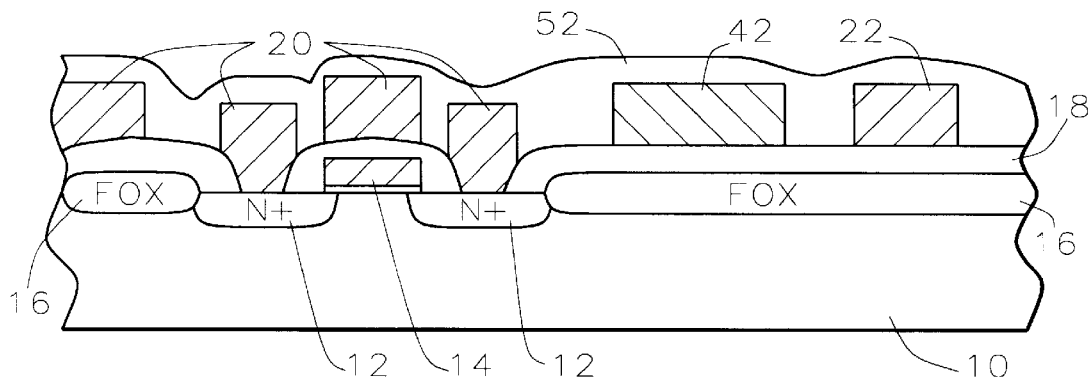
FIGS. 9A–9D is a sequence of cross sectional views that follow from FIG. 7 that illustrate a second preferred embodiment of the invention.

FIGS. 9A–9D, illustrate another preferred embodiment of the invention. As shown in FIG. 9A, a dielectric layer 52 is deposited over the metallurgy level by ozone-tetraethylorthosilicate ($O_3$-TEOS) techniques. This layer is deposited so that it covers the lines to a depth in the range of about 3000 to 15000 Angstroms. The layer is deposited by, for example Applied Material Corp. Precision 5000 machine under the conditions of pressure of 600 torr., temperature of 400° C., wherein plasma is used to generate the ozone by means associated with the machine. The ozone concentration is preferably about 9.5% in the oxygen carrier gas and the carrier gas flow rate is above 3000 sccm. The ozone concentration must be more than 9.0% to operate as we desire. The TEOS is carried to the reaction using Argon or Helium carrier gas flow rate of about 4600 sccm.

Figure 9B:
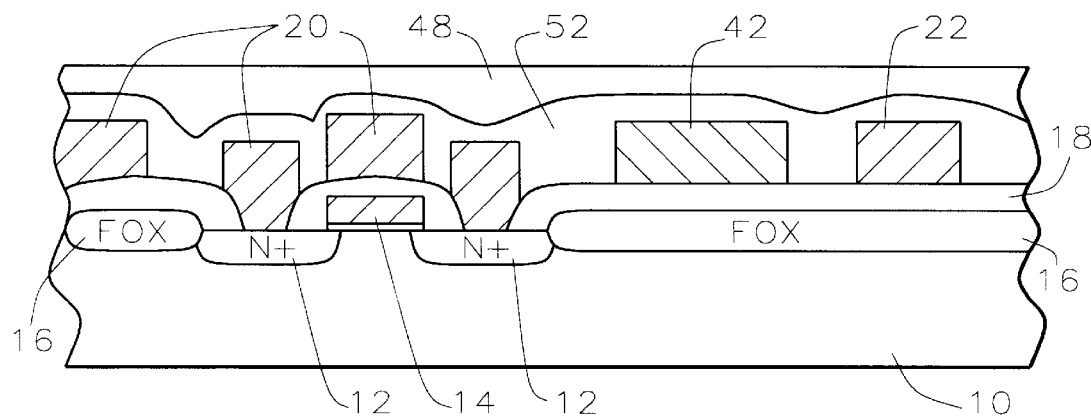
Figure 9C:
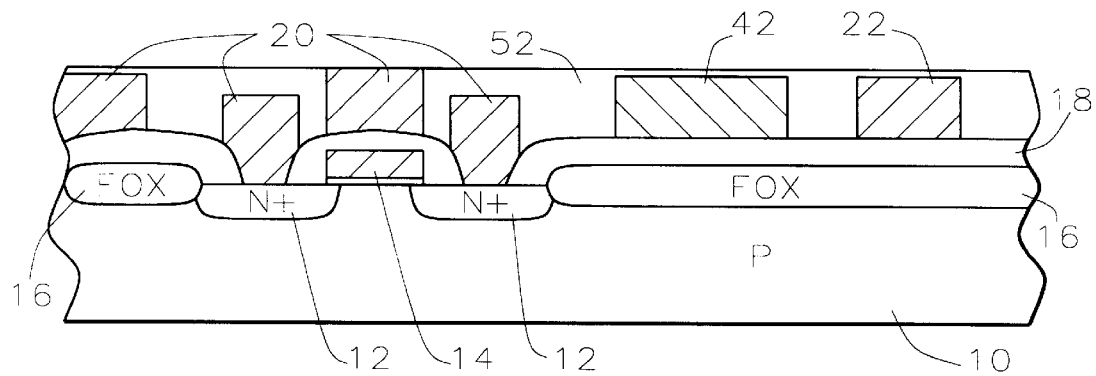
Figure 9D:
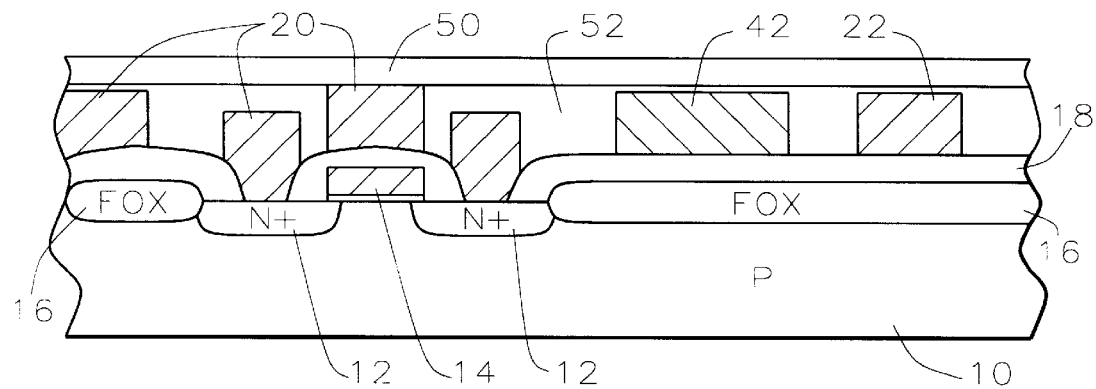

As shown in FIG. 9B, a layer 48 of spin-on-glass id deposited by the process previously described. The layer 48 is then etched back, as shown in FIG. 9C, and a layer 50 is deposited by plasma enhanced CVD, as previously described. Layer 50 has a thickness in the range of about 2000 to 8000 Angstroms. Additional, metallurgy layers are fabricated by repeating the aforedescribed steps.

Figure 10A:
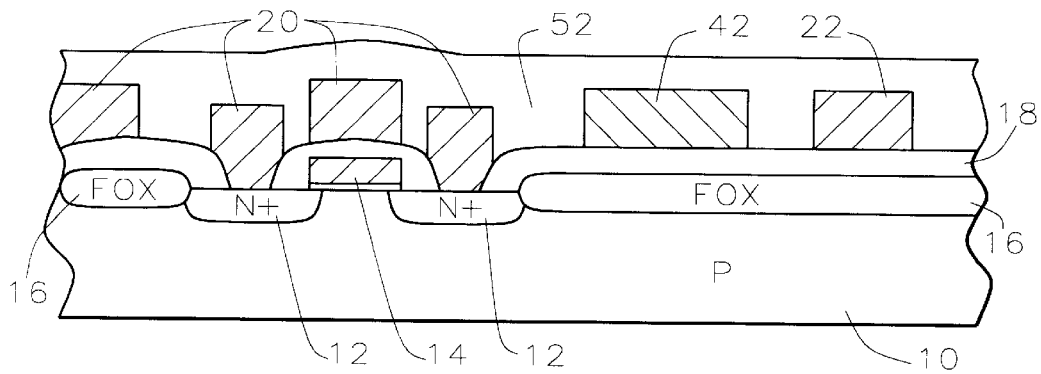
FIGS. 10A–10C is a sequence of cross sectional views that illustrate a third preferred embodiment of the invention.
Figure 10B:
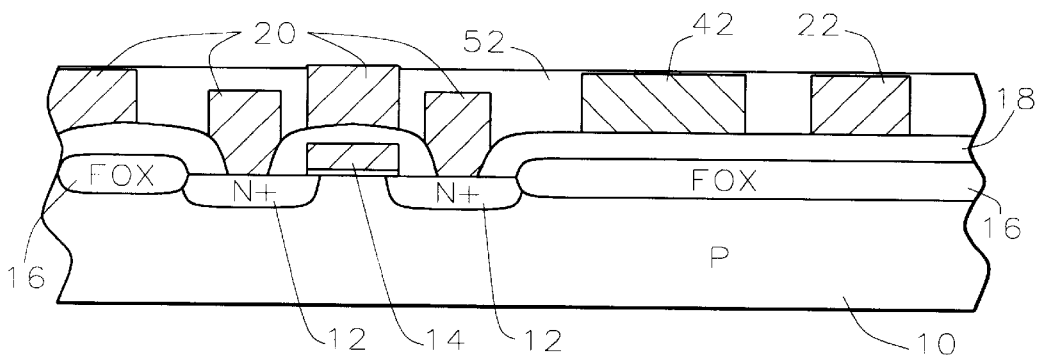
Figure 10C:
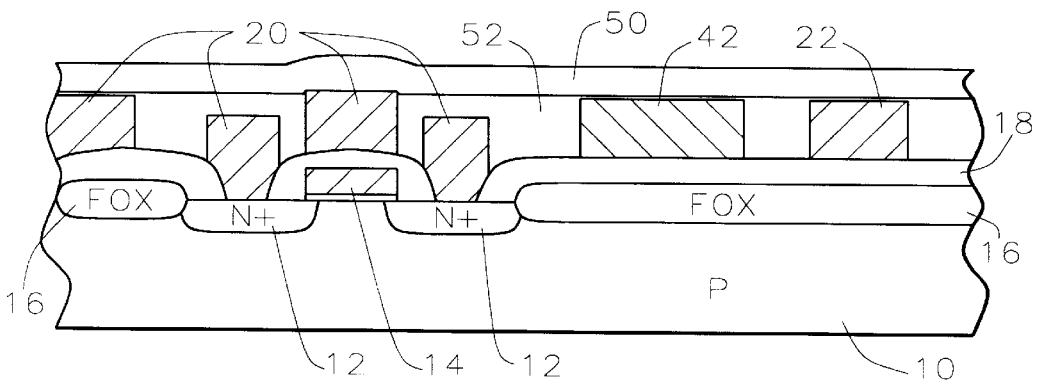

FIGS. 10A–10C depict another embodiment of the invention. In FIG. 10A, a layer 52 is deposited by $O_3$-TEOS, as previously described. Layer 52 is etched back, as shown in FIG. 10B, and a layer 50 deposited PE-CVD, as shown in FIG. 10C. Layer 52 is deposited so that it completely fills the spaces between the lines, and has a thickness of about 4000 to 10000 Angstroms above the lines. Layer 50 has a thickness in the range of about 2000 to 8000 Angstroms.

Referring now to FIG. 11, there is shown a substrate wherein there is a very wide space to be filled with dummy lines. Here to reduce metal hillocks which occur where dummy lines are very wide, we break up the wide dummy lines into many narrow dummy lines 44. In flow chart FIG. 6, this refers to the situation of boxes 36 and 38.

Figure 12:
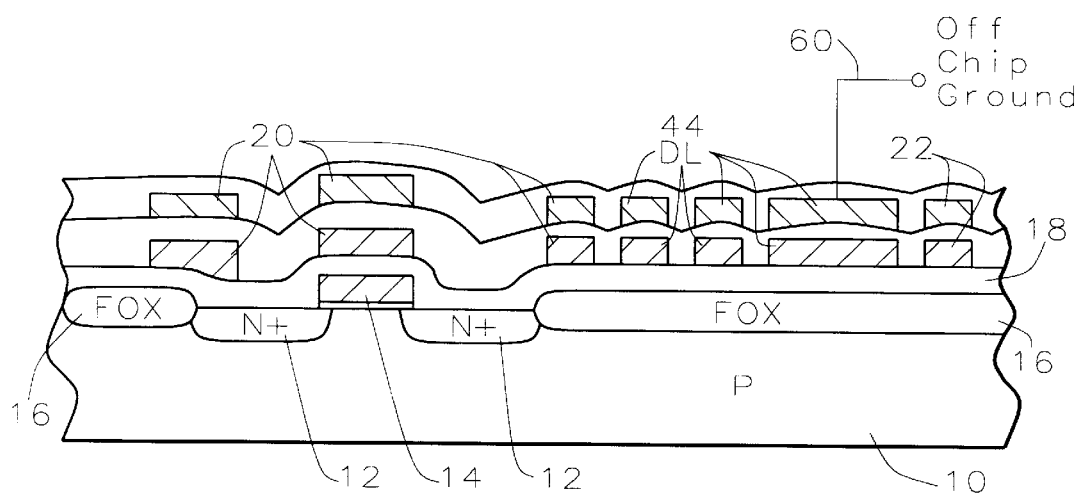
FIG. 12 is a cross sectional view illustrating a plurality of metallurgy layers, each with a plurality of adjacent spaced dummy lines.

Referring now to FIG. 12, the substrate is illustrated with a plurality of metallurgy levels. Each metallurgy level includes a plurality of dummy lines and is covered with a dielectric layer. The dummy lines 44 can be left floating, or can be grounded with line 60, depending on their location. When the dummy lines 44 are adjacent to signal lines, they should be grounded. In other locations, the grounding is not so critical.

While the invention has been particularly shown and described with reference to the preferred embodiments thereof, it will be understood by those skilled in the art, that various changes in form and details may be made without departing from the spirit and scope of the invention.

What is claimed is:

1. An improved integrated circuit semiconductor device having a multi-layer metallurgy system with essentially a planar global top surface comprising:

a semiconductor substrate;

a plurality of interconnection metallurgy levels on said semiconductor substrate, each level including a set of a plurality of close uniformly spaced operative conductive lines of a predetermined width and also operative conductive lines that are non-uniformly spaced relative to said set of close uniformly spaced operative conduct lines, said metallurgy level also including dummy lines between said set of uniformly spaced operative conductive lines and said non-uniformly spaced operative conductive lines where the spacing of the non-uniformly spaced operative conductive lines from the spaced set of operative conductive lines is equal to or greater than three times said predetermined width of a said operative conductive line; and a dielectric layer sandwiched between said metallurgy levels.

2. The semiconductor device of claim 1 wherein the spacing between said plurality of uniformly spaced operative conductive lines is approximately equal to said predetermined width of said operative conductive lines.

3. The semiconductor device of claim 2 wherein said predetermined width is equal to or less than 0.8 micrometers.

4. The semiconductor device of claim 2 wherein said predetermined width is approximately 0.5 micrometers.

5. The semiconductor device of claim 1 wherein said dummy lines are connected to ground potential.

6. The semiconductor device of claim 1 wherein said metallurgy levels each includes a plurality of parallel dummy lines in the areas between non-uniformly spaced conductive lines, where the spacing between the set of operative conductive lines and said non-uniformly spaced operative conductive lines is equal or greater that five times the predetermined width of the operative conductive lines.

7. The semiconductor device of claim 6 wherein the width of each of the lines in said plurality of dummy lines is substantially the same as the predetermined width of said operative conducive lines.

8. The semiconductor device of claim 2 wherein the thickness of said operative conductive lines and said dummy lines is equal.

9. The semiconductor device of claim 8 wherein the thickness of said dielectric layer is in the range of about 3000 to 10000 Angstroms.

* * * * *